(12) United States Patent
Suzuki et al.

(10) Patent No.: US 6,321,370 B1
(45) Date of Patent: Nov. 20, 2001

(54) METHOD OF SUPPORTING ARRANGEMENT OF SEMICONDUCTOR INTEGRATED CIRCUIT

(75) Inventors: Katsuyoshi Suzuki, Hadano; Toru Hiyama, Yokohama, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/254,875

(22) PCT Filed: Sep. 17, 1996

(86) PCT No.: PCT/JP96/02657

§ 371 Date: Mar. 16, 1999

§ 102(e) Date: Mar. 16, 1999

(87) PCT Pub. No.: WO98/12655

PCT Pub. Date: Mar. 26, 1998

(51) Int. Cl.[7] ...................................................... G06F 17/50
(52) U.S. Cl. ..................... 716/11; 716/2; 716/7; 716/8; 716/9; 716/10
(58) Field of Search ................................ 716/17, 2, 7–11

(56) References Cited

U.S. PATENT DOCUMENTS 5,666,288 * 9/1997 Jones et al. .............................. 716/17

FOREIGN PATENT DOCUMENTS 06-124320 5/1994 (JP) .
10011489A * 1/1998 (JP) .

* cited by examiner

Primary Examiner—Matthew Smith
Assistant Examiner—Jibreel Speight
(74) Attorney, Agent, or Firm—Mattingly, Stanger & Malur, P.C.

(57) ABSTRACT

Optimal layout of logic elements of semiconductor integrated circuits is achieved in conformity with the intention of the logic designer in a short period of time in an interactive mode. When logic blocks are to be laid out on a display screen, a logic block file consisting at least of logic block names, logic block sizes, and information on connection relationships with other logic blocks is used, and logic blocks essential for the designer's intention are laid out in random positions on a display screen, and then the connection relationships among the logic blocks are displayed according to the logic block file. In this procedure, whether the layout is appropriate or not is made readily recognizable by a table of relationships among the logic blocks.

12 Claims, 10 Drawing Sheets

| NUMBER OF NETS BETWEEN BLOCKS | DESTANCE BETWEEN BLOCKS |
|---|---|
| 0~5 | 1000 micron |
| 6~10 | 800 micron |
| 11~15 | 600 micron |
| 16~20 | 400 micron |
| ⋮ | ⋮ |

METHOD OF SUPPORTING ARRANGEMENT OF SEMICONDUCTOR INTEGRATED CIRCUIT

TECHNICAL FIELD

The present invention relates to a method for processing the layout of logic elements of semiconductor integrated circuits, and particularly to a method for processing the layout of logic elements of semiconductor integrated circuits in which the layout of logic elements or logic element groups are instructed from outside, and the layout of logic elements is optimized with respect to signal transfer delays.

BACKGROUND ART

Examples of the prior art related to a method for processing the layout of logic elements of semiconductor integrated circuits include a technique described in the Japanese Patent Laid-Open Publication No. 8-274177 is known. This example of the prior art provides a method for processing the layout of logic elements to optimize the layout of the logic elements with respect to signal transfer delays in which each logic element of a logic element group, which is logically divided into logic block units, each consisting of logic elements, and logically designed in a hierarchical structure, and is laid out on a semiconductor integrated circuit board, with the logic elements belonging to the same logic block being clustered together in the layout.

According to the example of the prior art described in the aforementioned Japanese Patent Laid-Open Publication No. 7-73643, layout is processed by causing information for optimizing the layout of logic elements with respect to signal transfer delays to be automatically recognized by the connection relationship among the logic elements.

However, this example of the prior art takes into consideration the connection relationship among all the logic elements and, since semiconductor integrated circuits have recently taken on much larger scales, it is anticipated that enormous processing hours will be required if the entire layout is to be processed in this manner, which might prove to be a factor to prevent the layout to be designed in a short period of time.

Yet, since logic elements to be taken account of in addressing signal delays or the like are limited to some specific logic elements, and likewise what governs the operating speed of a semiconductor integrated circuit is the signal transfer time pertaining to connection among specific logic elements, it was found unnecessary to optimize the layout of all the logic elements.

An object of the present invention, therefore, is to provide a method for processing the layout of logic elements of semiconductor integrated circuits capable of enabling the layout design to be accomplished in a short period of time by optimizing the layout of logic elements.

DISCLOSURE OF THE INVENTION

To accomplish the above-mentioned object, the present invention provides for the following configuration.

1. The optimal layout of logic blocks is determined by providing in advance a logic block file consisting at least of logic block names, logic block sizes, and information on connection relationships with other logic blocks; displaying a list of logic block names extracted from the logic block file as a logic block name list; laying out logic blocks chosen at random from the logic block name list on the aforesaid circuit board layout drawing in accordance with logic block sizes in the aforementioned logic block file; and displaying the relationships among the laid-out logic blocks according to the connection relationships with other logic blocks in the aforementioned logic block file. This enables the operator to readily confirm whether or not the layout of logic blocks satisfies the conditions of locatability on a display screen, and it is highly effective in determining the layout of semiconductor integrated circuits.

2. A table showing the matching between connection relationships among logic blocks and the conditions of locatability pertaining to the relative positions of logic blocks is provided in advance, and any logic block failing to satisfy the conditions of locatability is made readily recognizable by the operator by identifying the logic block. This enables the operator to readily know whether or not the position in which each logic block has been laid out is appropriate.

3. As regards any logic block failing to satisfy the conditions of locatability, the logic block can be laid out in a position satisfying the conditions of locatability by identifying and shifting the logic block.

BEST MODE FOR CARRYING OUT THE INVENTION

An embodiment of the present invention is described in detail below with reference to the drawings.

Figure 2:
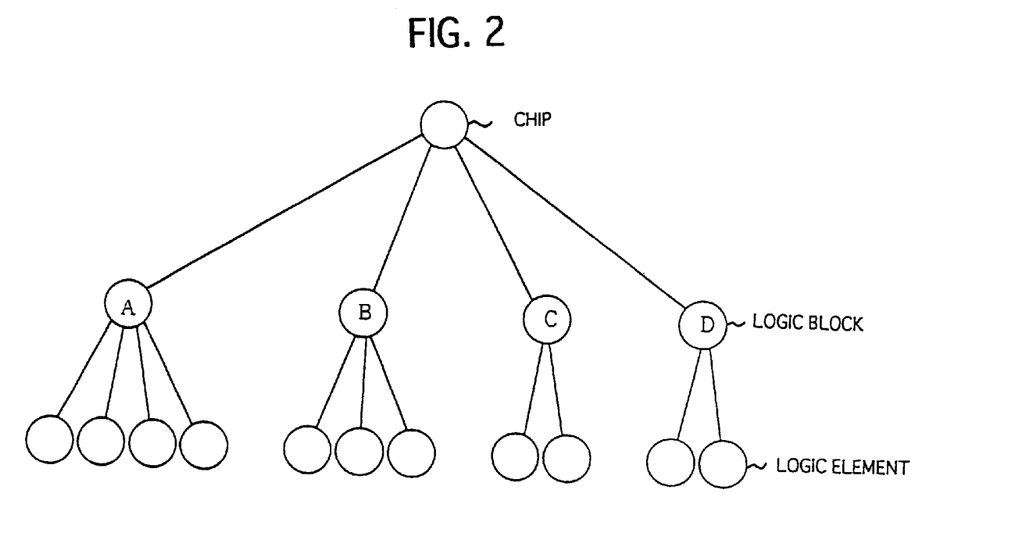
FIG. 2 is a diagram showing a hierarchical arrangement of semiconductor integrated circuits according to the invention.

First, FIG. 2 shows the hierarchy of semiconductor integrated circuits to facilitate description of the invention. Here, a group of logic elements (206, for example) is a logic block (202, for example), and this logic block (202) is divided into clusters of one function or another. In addition, a group of assemblies (202 to 205) of these logic blocks (202) is called as a chip (201).

The logic block is described in further detail with reference to FIG. 3.

Figure 3:
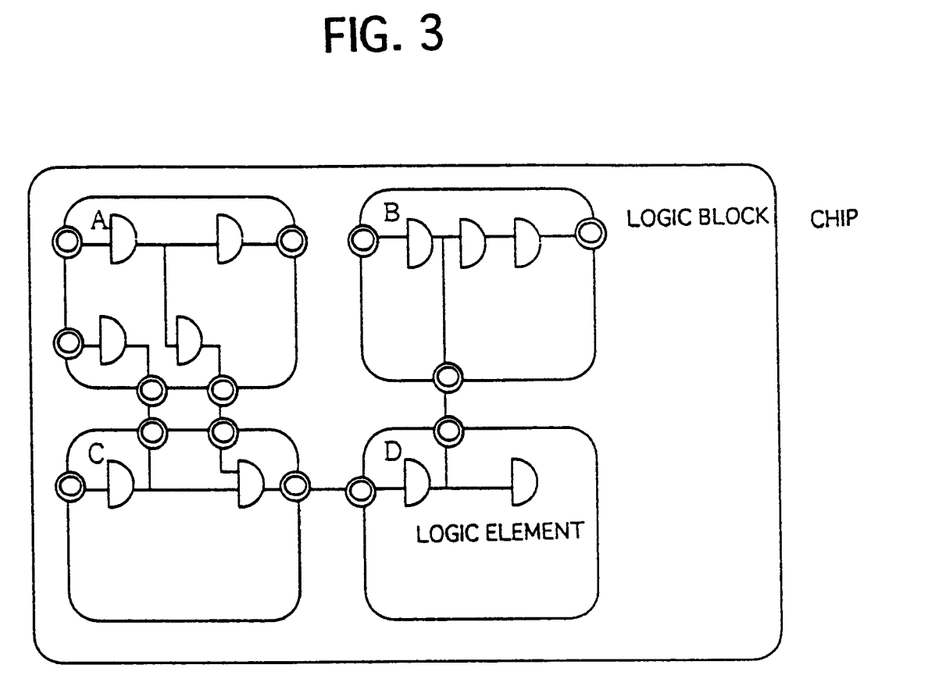
FIG. 3 is a diagram showing the hierarchical arrangement of semiconductor integrated circuits according to the invention at the level of logic elements.

FIG. 3 is an example of a connection diagram showing the hierarchical structure of FIG. 2 at the logic element level.

A chip 201 consists of four logic blocks (A, B, C, and D). There are connection relationships in pairs of these logic blocks, and the example of FIG. 3 shows that there are two connection relationships between logic blocks A and C, and there is one connection relationship each between logic blocks C and D and between logic blocks B and D.

With the foregoing description kept in mind, the flow of each process in a method for supporting the layout process of semiconductor integrated circuits pertaining to one embodiment of the present invention is described with reference to the flowchart of FIG. 1.

First, as minimum required information, information on logic blocks (logic block names, logic sizes, names of logic blocks having connections and the number of connecting lines) is extracted from a file of logic information showing the logic sizes (the number of gates, for example) of the logic blocks constituting the aforesaid chip and the number of connecting lines between one logic block and the other logic block paired therewith, and a file of a logic block name list is prepared (101).

Next, underlying information to provide the basis underlying the layout of a semiconductor integrated circuit chip will be prepared (102).

Figure 5:
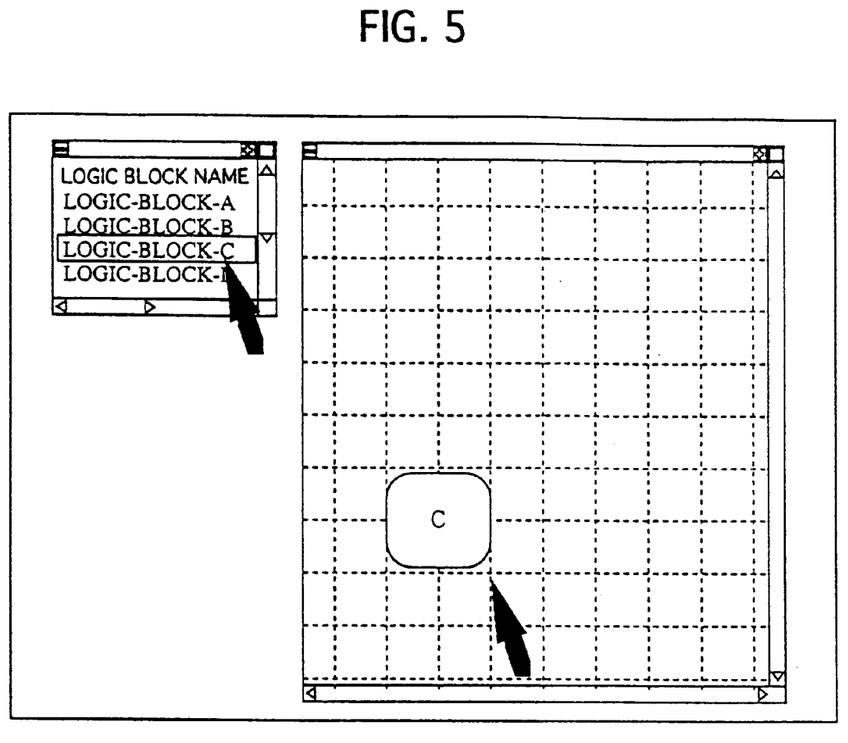
FIG. 5 is a diagram showing another example of operation on a display screen according to the invention.

The underlying information may be anything expressed by X- and Y-coordinates in two dimensions, or a grid, for example. Then, on the display screen of a workstation or the like, the logic block name list and the underlying information extracted at steps 101 and 102 are displayed in different windows (103). A position wherein it is desired to locate a logic block chosen from the window displaying the logic block name list described above is designated in the underlying information displayed in the other window, and the logic block is located there (104). This process will be repeated for other logic blocks, if necessary (106). Further, whereas details will be described later with reference to FIG. 5 is explained, when each logic block is to be laid out in the underlying information, it is conceivable to consider the logic scale of each logic block and locate the designated logic block in a size reflecting its logic scale.

When a rough layout has been finished, the degrees of connecting line linkage between logic blocks are displayed in the underlying information window.

A conceivable way of displaying a link between logic blocks is, for example, to span the connected logic blocks with a line segment. Further, for the degree of linkage, the table shown in FIG. 10, for example, can be programmed in a memory, and the relationships of signal transfer delays and the like in a layout of logic blocks according to the conditions of locatability of this table are displayed. Where this arrangement is adopted, by referring to this file, the width of the above-mentioned segment between the logic blocks may be varied by, for instance, making it thicker or thinner, changing its color, or combining the changes in line thickness and color in accordance with the conditions of locatability for logic blocks (108). Where this does not fit the conditions of locatability, the operator is told so by flashing the segment or changing its color.

When the position where logic blocks were first arranged satisfies the requirement regarding signal transfer delays (109), the result of layout instruction in this arrangement of the logic blocks is output to the file (113).

When the conditions of locatability are not met in terms of the requirement regarding signal transfer delays or the like, the layout position is changed again, and the degree of linkage is checked (112). Incidentally, how to relocate logic blocks will be explained later with reference to FIG. 9.

Finally, for the other logic blocks, which need no consideration for signal transfer delays, than the specific logic blocks laid out on the chip in advance, layout processing is accomplished by inputting the programmed file into an automatic layout system.

The foregoing is an outline of the present invention, and this method enables logic blocks to be laid out as intended by a designer and a layout satisfying the requirement regarding signal transfer delays to be realized.

Next, referring to the logic block name list, the underlying information and the table of inter-logic-block relationships, shown on display screens illustrated in FIGS. 4 through 10, the process explained in FIG. 1 will be described in further detail.

Figure 1:
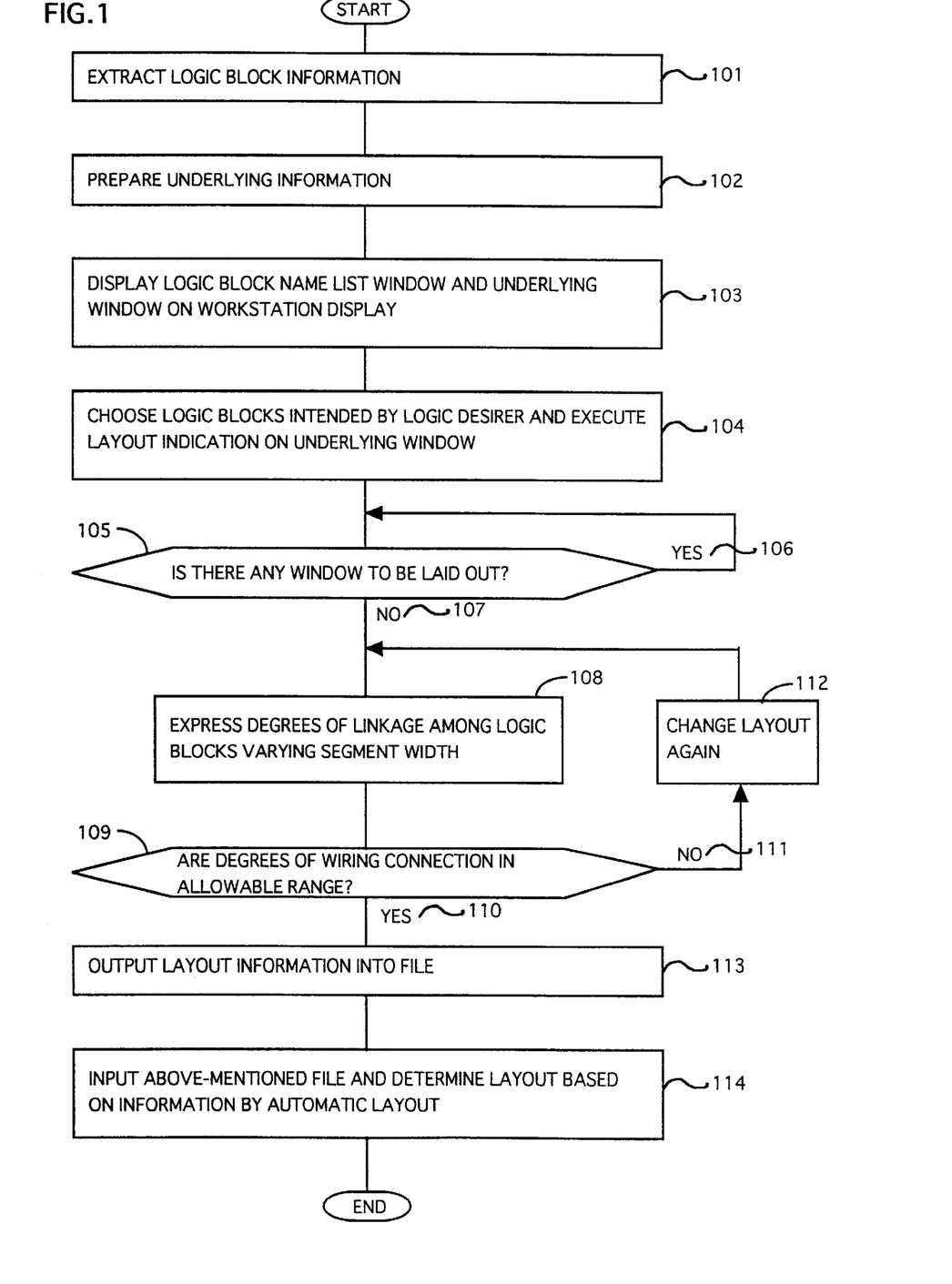
FIG. 1 is a process flowchart showing a process flow regarding layout support for semiconductor integrated circuits according to the present invention.
Figure 4:
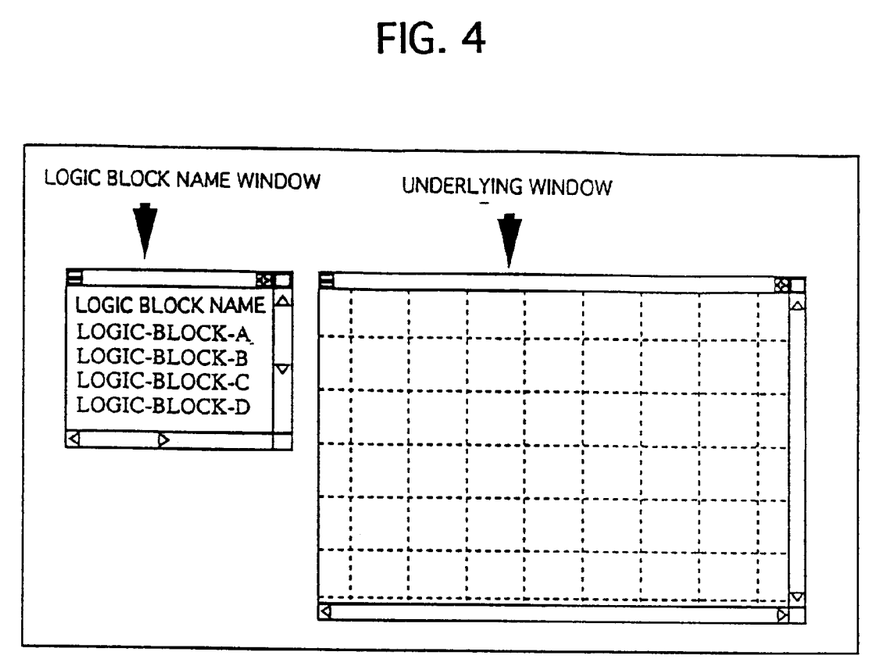
FIG. 4 is a diagram showing an example of operation on a display screen according to the invention.

FIG. 4 illustrates a state wherein, at step 103 of the flowchart in FIG. 1, a logic block name window (401) for displaying a logic block name list and an underlying window (402) for displaying the underlying information are shown on a display screen.

In FIG. 4, logic blocks A, B, C, and D in FIG. 3 are represented by names LOGIC-BLOCK-A, LOGIC-BLOCK-B, LOGIC-BLOCK-C and LOGIC-BLOCK-D, respectively.

Next, process to lay out logic blocks in the underlying window will be described with reference to FIG. 5.

In FIG. 5, first, the logic block name window is chosen as the active window, and the logic block whose location is desired to be designated is selected out of this window. Second, the underlying window is activated, and the previously chosen logic block is laid out in the underlying window by designating the position desired for its arrangement. Incidentally, it is conceivable to accomplish this layout by pointing the prescribed position with a mouse or the like. Conceivable aids for identifying the position of a logic block in the underlying window include X- and Y-coordinates and a grid. In this embodiment, a grid will be used. In this case, a reference point is to be determined somewhere in the corner, to be expressed two-dimensionally as (1, 1).

The embodiment in FIG. 5, first, the LOGIC-BLOCK-C is selected as the logic block whose position is desired to be designated, and an arrow or the like is initially displayed in the underlying window to indication the position where the selected LOGIC-BLOCK-C is to be laid out. The operator designates the desired layout position with this arrow to display the LOGIC-BLOCK-C as shown in FIG. 5. Incidentally, although the logic block is represented by a square in this embodiment, the area of this square can be approximated to the actual layout by calculating the area needed to accommodate the logic elements in the logic block on the basis of the logic scale of the logic block that is extracted when the logic information file is read, and displaying an area comparable to that. Since this is only a roughly estimated area, a circle or any other rectangular shape than a square may be used as well.

Figure 6:
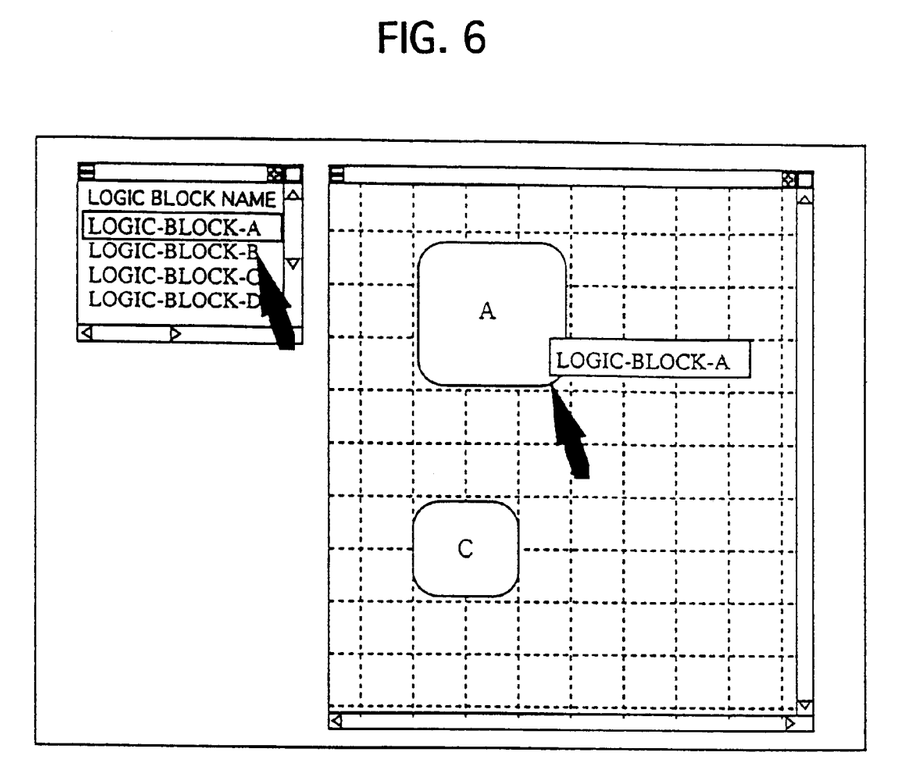
FIG. 6 is a diagram showing still another example of operation on a display screen according to the invention.

In FIG. 6, as in FIG. 5, the LOGIC-BLOCK-A is selected from the logic block name window, and then the LOGIC-BLOCK-A is designated in the underlying information in the underlying window. Here, since the number of logic elements in the LOGIC-BLOCK-A is double that in the LOGIC-BLOCK-C, the representing area on the screen is also approximately doubled. Once the layout has been done, conceivable ways to distinguish the logic blocks from each other according to the underlying information in the underlying window include, for example, displaying logic block names in the logic block name window in colors different from each other, in the same colors in which the respectively corresponding logic blocks are solidly marked in the underlying information. It is also conceivable to display a logic block name near the logic block it denotes by clicking with a mouse the logic block laid out in the underlying information in the underlying window.

Figure 7:
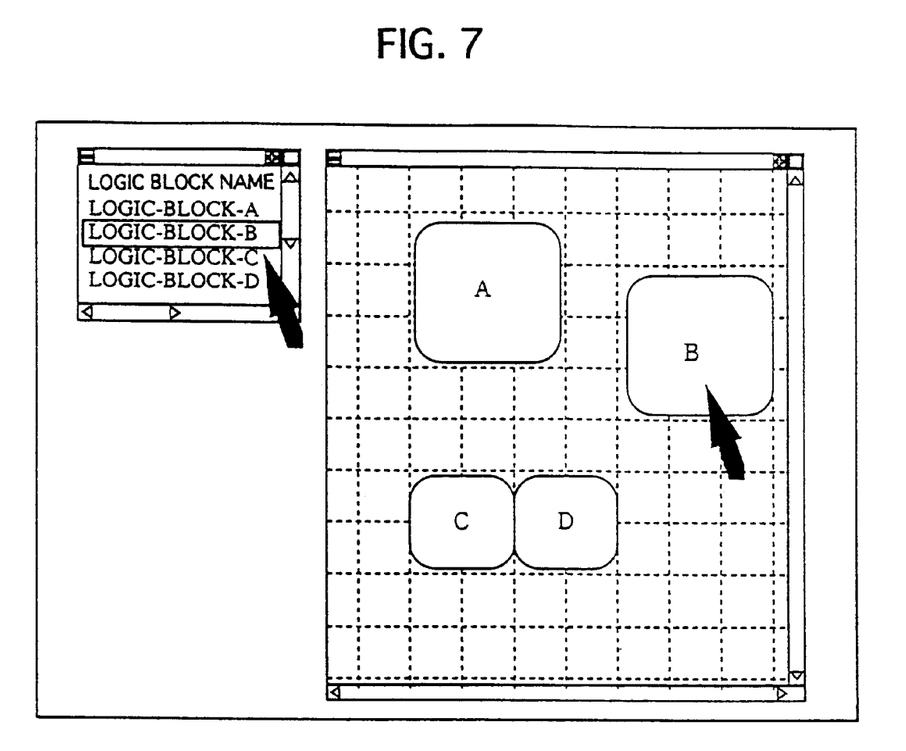
FIG. 7 is a diagram showing yet another example of operation on a display screen according to the invention.

Arranging the LOGIC-BLOCK-B and the LOGIC-BLOCK-D is also accomplished in the same manner as shown in FIG. 7.

Next, processing to display the connection relationships among logic blocks will be described with reference to FIG. 8.

Figure 8:
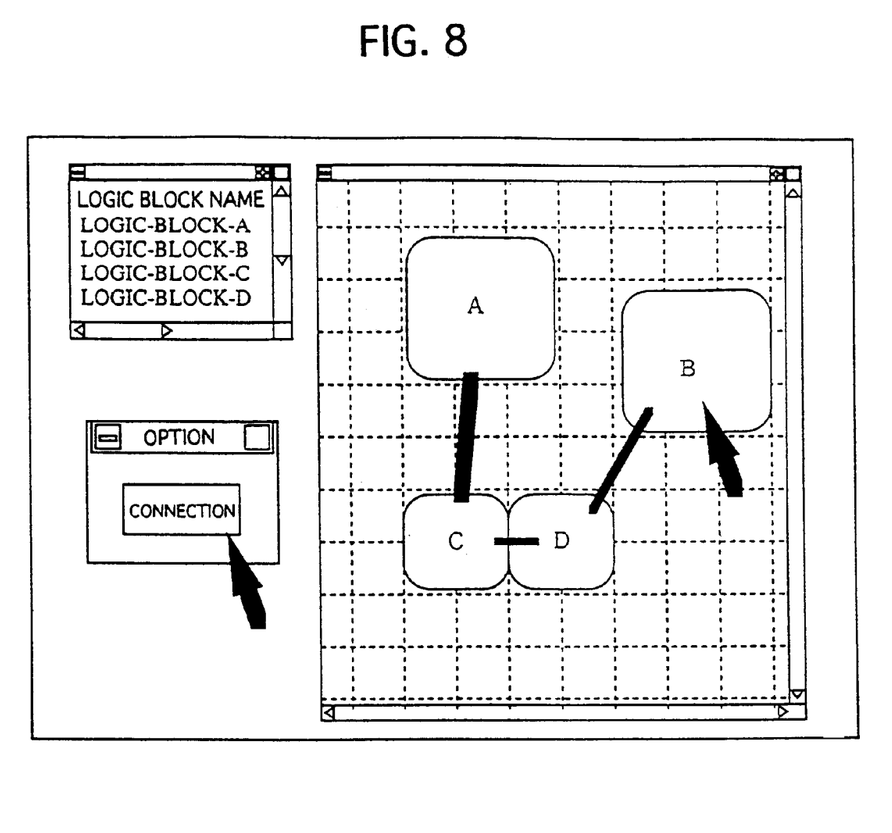
FIG. 8 is a diagram showing a further example of operation on a display screen according to the invention.
Figure 10:
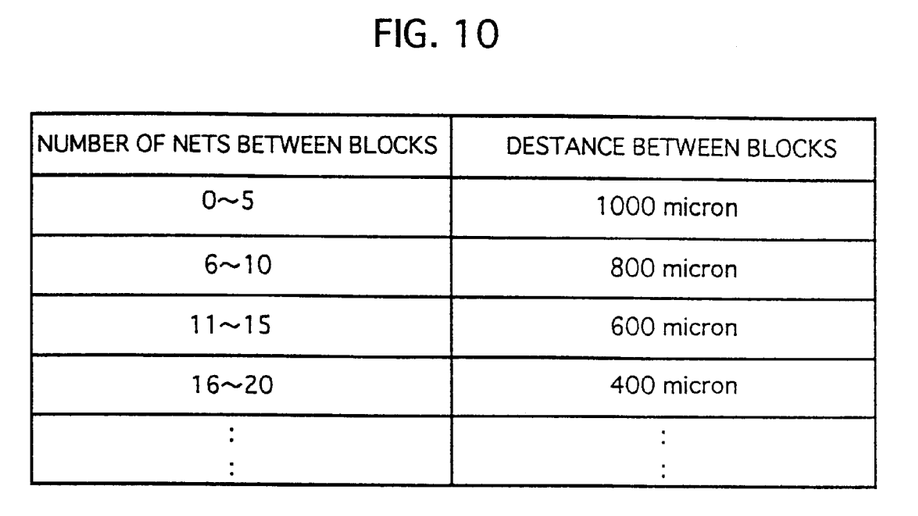
FIG. 10 is a table of inter-logic-block relationships showing relationships between the number of connecting nets between logic blocks and the corresponding block distance conditions according to the invention.

When the desired layout of the logic blocks in the underlying information in the underlying window is finished, the state of connection among the logic blocks in the underlying window is expressed in segments spanning the logic blocks by, for example, using a connection button on an optional window as shown in FIG. 8 prepared in advance. In this case, it can be recognized that there are connection relationships between the LOGIC-BLOCK-A and the LOGIC-BLOCK-C, between the LOGIC-BLOCK-C and the LOGIC-BLOCK-D, and between the LOGIC-BLOCK-D and the LOGIC-BLOCK-B. Furthermore, where the conditions of locatability between logic blocks are to be indicated, a method of expression to vary the thickness of each segment is conceivable. This factor, the thickness of the segment is determined, for example, by the number of nets between blocks as shown in FIG. 10, and is expressed as shown in FIG. 8. Once the layout is accomplished and the connection relationships are expressed in this manner, it can be recognized at first sight that the logic blocks connected by a thick segment should desirably be as close as practicable to each other. In this example, since the degree of linkage between the LOGIC-BLOCK-A and the LOGIC-BLOCK-C is higher than elsewhere, the segment is made thicker than that between the LOGIC-BLOCK-C and the LOGIC-BLOCK-D or that between the LOGIC-BLOCK-D and the LOGIC-BLOCK-B. Besides varying the thickness of segments, a variety of other ways of expression such as varying the color of segments, using different sorts of segments, and flashing some of the segments are conceivable. The choice may depend on relative user-friendliness. Otherwise, where the distance between logic blocks is too long and the their positional relationship does not satisfy the requirement regarding signal transfer delays, such representation as warning by flashing the connecting lines is also conceivable.

Figure 9:
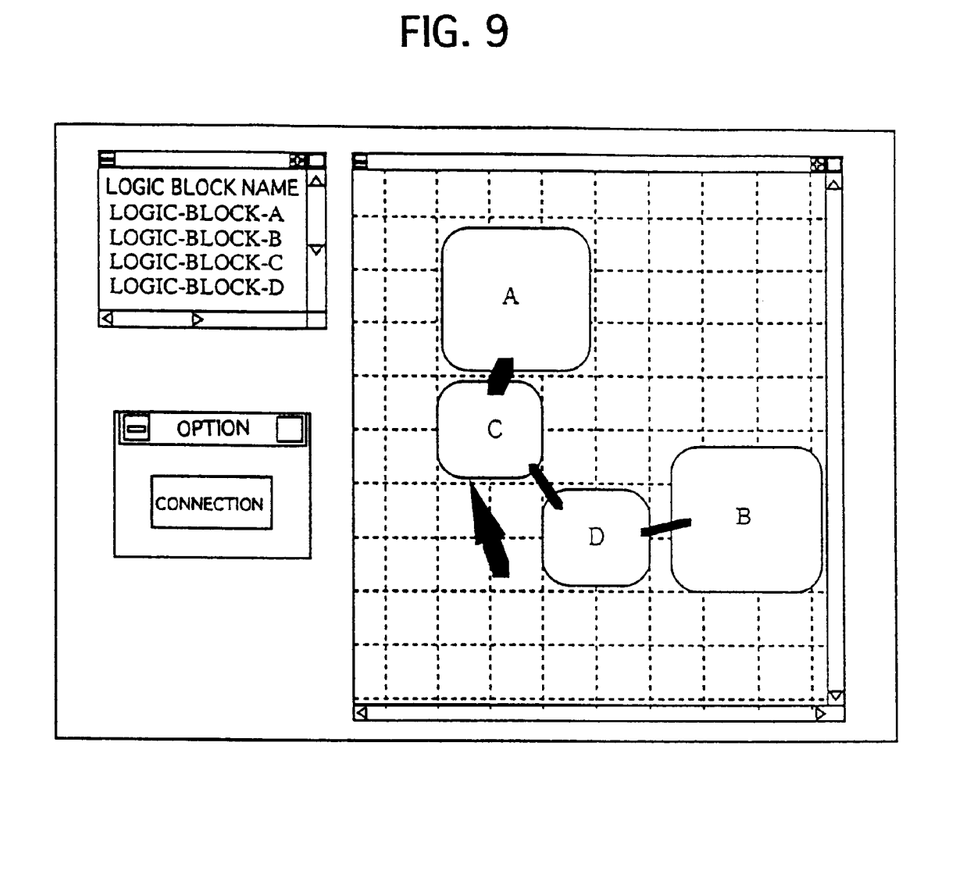
FIG. 9 is a diagram showing a still further example of operation on a display screen according to the invention.

Next will be described, with reference to FIGS. 8 and 9, a case in which the layout of logic blocks, after it has been done and connection relationships are displayed, is found failing to meet the conditions of locatability, and the positions of the logic blocks have to be rearranged.

The layout of logic blocks, with their connection relationships displayed, in FIG. 8, had better be revised to bring the LOGIC-BLOCK-A and the LOGIC-BLOCK-C close to each other to satisfy the requirement regarding signal transfer delays, because the segment between them is thick as illustrated, indicating a higher degree of linkage. Therefore, by choosing and designating the area of the LOGIC-BLOCK-C as shown in FIG. 9 for example, the LOGIC-BLOCK-C is shifted upward to bring it as close as practicable to the LOGIC-BLOCK-A. As to the problem of whether or not the logic block to be shifted satisfies the conditions of locatability, either the conditions may be compared anew after the relocation, or the current position may be checked with the conditions of locatability as it is shifted, and, when the block has arrived at a position satisfying the conditions of locatability, the operator would be told so (by, for example, stopping the flashing and returning to the normal display). Further, in this embodiment, since the relationship between the LOGIC-BLOCK-B and the LOGIC-BLOCK-D also requires a similar level of linkage to that between the LOGIC-BLOCK-C and the LOGIC-BLOCKS-D, the LOGIC-BLOCK-B is also shifted to a suitable position. This layout indication makes it possible for the layout to satisfy the requirement regarding signal transfer delays.

The result of the layout indication of the logic blocks in such a manner is output into a file as a layout indication in a combination of a logic block name and two-dimensional coordinates, for example, and later a layout and a wiring arrangement satisfying the requirement regarding signal transfer delays as intended by the logic designer can be achieved by inputting the prepared file under an automatic layout processing program and determining the layout with reference to this layout indication.

Although only four logic blocks are supposed to be used in this embodiment to simplify explanation, it goes without saying that, in the realm of actual logic designing, the logic scale continues to enlarge, and a similar process can be applied to the layout of tens, or even hundreds, of logic blocks. By having the logic designer perform such layout designation for logic blocks, in advance of automatic layout, by the technique according to the invention described above, the automatic layout processing can be simplified to make possible high speed processing. Furthermore, since a logic designer well versed in the logic designates the layout, there will be a significant effect to prevent excessive elongation of signal transfer delays.

In addition, while the above-described embodiment exemplifies the layout designation of logic blocks, if the logic block unit is supposed to consist of one logic element, a similar technique can be readily applied to layout designation on an element-by-element basis, making possible more detailed layout designation satisfying the requirement regarding signal transfer delays at the signal wiring level and, accordingly, the intended layout design of semiconductor integrated circuits.

INDUSTRIAL APPLICABILITY

According to the present invention, in determining the layout of logic blocks in a logic having strict limitations regarding signal transfer delays, the logic designer is enabled to readily designate the layout he or she intends in an interactive mode with the logic block name and the underlying information displayed on a display screen, and to express the degrees of linkage along with the designation.

Further, it is also made possible to simplify the process algorithm taking into consideration the limitations regarding signal transfer delays in automatic layout processing and to shorten the processing time by laying out in advance only those logic blocks and/or logic elements which are essential for the designer's intention and handing over the result of the layout indication in a file form to the automatic layout system, so that the rest of logic blocks and/or logic elements can be left to automatic layout processing.

Furthermore, in contrast to laying out all the blocks and/or elements automatically, the optimal result of layout wiring taking into consideration the requirement regarding signal transfer delays on the whole can be obtained since the designer's knowledge is fully reflected in the layout.

What is claimed is:

1. A method for supporting the layout of semiconductor integrated circuits to determine the laid-out positions of logic blocks, by laying out logic blocks each comprising a plurality of logic elements on a layout drawing of a semiconductor integrated circuit board in an interactive mode, comprising the steps of:

(a) providing in advance a logic block file comprising at least logic block names, logic block sizes and information on connection relationships with other logic blocks by extracting from a file of logic information;

(b) preparing underlying information to provide the basis underlying the layout of a semiconductor integrated circuit chip;

(c) displaying a list of logic block names extracted from said logic block file as a logic block name list in a logic block name window and underlying information in an underlying window on a display;

(d) choosing the logic block name to be laid out from the logic block name window after activating the logic block name window;

(e) executing the layout of said chosen logic block in the underlying window by designating a position for arrangement of said chosen logic block in accordance with the logic block scale of said logic block file after activating the underlying window;

(f) repeating the steps (d) and (e) for other logic blocks to be laid out, if necessary; and (g) displaying the relationship of the laid-out logic block in the underlying window on the display according to its connection relationships with other logic blocks in said logic block file.

2. A method for supporting the layout of semiconductor integrated circuits according to claim 1, comprising the steps of:

providing in advance a table showing matching between connection relationships among logic blocks and conditions of locatability pertaining to the relative positions of logic blocks; and displaying degrees of linkage among logic blocks according to said table where relationships among laid-out logic blocks are to be displayed according to connection relationships with other logic blocks of said logic block file.

3. A method for supporting the layout of semiconductor integrated circuits according to claim 2, comprising the steps of:

displaying a connection between logic blocks according to said table by spanning the logic blocks having a connection relationship with a line segment; and expressing the degree of linkage by varying the thickness of the segment in accordance with the number of nets between the logic blocks.

4. A method for supporting the layout of semiconductor integrated circuits according to claim 3, further comprising the step of:

changing a manner of displaying the segment spanning logic blocks failing to satisfy the conditions of locatability according to said table when displaying the degrees of linkage among logic blocks.

5. A method for supporting the layout of semiconductor integrated circuits according to claim 4, further comprising the step of:

accomplishing the change of the displaying manner of said segment by flashing the segment.

6. A method for supporting the layout of semiconductor integrated circuits according to claim 4, further comprising the steps of:

relocating the logic blocks failing to satisfy the conditions of locatability; and after the relocation, further checking with respect to the conditions of locatability.

7. A method for supporting the layout of semiconductor integrated circuits according to claim 4, further comprising the steps of:

designating and relocating the logic blocks failing to satisfy the conditions of locatability.

8. A method for supporting the layout of semiconductor integrated circuits according to claim 7, further comprising the step of:

confirming again whether or not the conditions of locatability are satisfied after the relocation.

9. A method for supporting the layout of semiconductor integrated circuits according to claim 8, further comprising the step of:

outputting the layout of the logic blocks satisfying the conditions of locatability.

10. A method for supporting the layout of semiconductor integrated circuits according to claim 9, further comprising the step of:

canceling the changed manner of displaying of the segment, when accomplishing relocation, during shifting of the designated logic blocks.

11. A method for supporting the layout of semiconductor integrated circuits according to claim 2, further comprising the step of:

expressing a logic block failing to satisfy the conditions of locatability according to said table when displaying the degrees of linkage among logic blocks.

12. A method for supporting the layout of semiconductor integrated circuits according to claim 11, further comprising the steps of:

relocating the logic block failing to satisfy the conditions of locatability; and after the relocation, further checking with respect to the conditions of locatability.

* * * * *